United States Patent

(12) United States Patent
Zhang et al.

(10) Patent No.: US 10,461,498 B2
(45) Date of Patent: *Oct. 29, 2019

(54) COMMON CATHODE LASER DRIVING CIRCUIT

(71) Applicant: Google LLC, Mountain View, CA (US)

(72) Inventors: Tao Zhang, Mountain View, CA (US);
Liang Du, Santa Clara, CA (US);
Xiangjun Zhao, Fremont, CA (US);
Changhong Joy Jiang, Dublin, CA (US); Cedric Fung Lam, San Carlos, CA (US); Shuang Yin, Sunnyvale, CA (US); Adam Edwin Taylor Barratt, Portland, OR (US)

(73) Assignee: Google LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/148,526

(22) Filed: Oct. 1, 2018

(65) Prior Publication Data
US 2019/0036302 A1 Jan. 31, 2019

Related U.S. Application Data

(63) Continuation of application No. 15/631,594, filed on Jun. 23, 2017, now Pat. No. 10,103,513.

(51) Int. Cl.
H01S 5/042 (2006.01)
H01S 5/068 (2006.01)
(Continued)

(52) U.S. Cl.
CPC ............ H01S 5/042 (2013.01); H01S 5/0428 (2013.01); H01S 5/068 (2013.01); H01S 5/06256 (2013.01); H04B 10/2503 (2013.01); H04B 10/40 (2013.01); H04J 14/0265 (2013.01); H04J 14/0282 (2013.01); H01S 5/125 (2013.01); H01S 5/3013 (2013.01)

(58) Field of Classification Search
CPC ...... H04B 10/504; H01S 5/0428; H01S 5/125
See application file for complete search history.

(56) References Cited

U.S. PATENT DOCUMENTS 5,088,097 A 2/1992 Ono et al.
9,281,899 B2 3/2016 Wang et al.
(Continued)

Primary Examiner — Michael Carter
(74) Attorney, Agent, or Firm — Honigman LLP; Brett A. Krueger

(57) ABSTRACT

A method for biasing a tunable laser during burst-on and burst-off states through a common-cathode laser driving circuit includes delivering a bias current to an anode of a gain-section diode having a shared substrate with the laser, and receiving a burst mode signal indicative of a burst-on state or a burst-off state. When the burst mode signal is indicative of the burst-off state, the method includes sinking a sink current away from the anode of the gain-section diode. The sink current is less than the bias current delivered to the anode of the gain-section diode. When the burst mode signal transitions to be indicative of the burst-on state from the burst-off state, the method includes ceasing the sinking of the sink current away from the anode of the gain-section diode, and delivering an overshoot current to the anode of the gain-section diode to accelerate heating of the gain-section diode.

27 Claims, 9 Drawing Sheets

(51) Int. Cl.
  *H01S 5/0625*  (2006.01)
  *H04J 14/02*   (2006.01)
  *H04B 10/40*   (2013.01)
  *H04B 10/25*   (2013.01)
  *H01S 5/125*   (2006.01)
  *H01S 5/30*    (2006.01)

(56) References Cited

U.S. PATENT DOCUMENTS

| | | | |
|---|---|---|---|
| 10,103,513 B1 * | 10/2018 | Zhang | H04B 10/2503 |
| 2002/0075919 A1 * | 6/2002 | Tochio | H01S 5/042 |
| | | | 372/38.02 |
| 2014/0341593 A1 | 11/2014 | van Veen et al. | |
| 2015/0063812 A1 | 3/2015 | Dove et al. | |

* cited by examiner

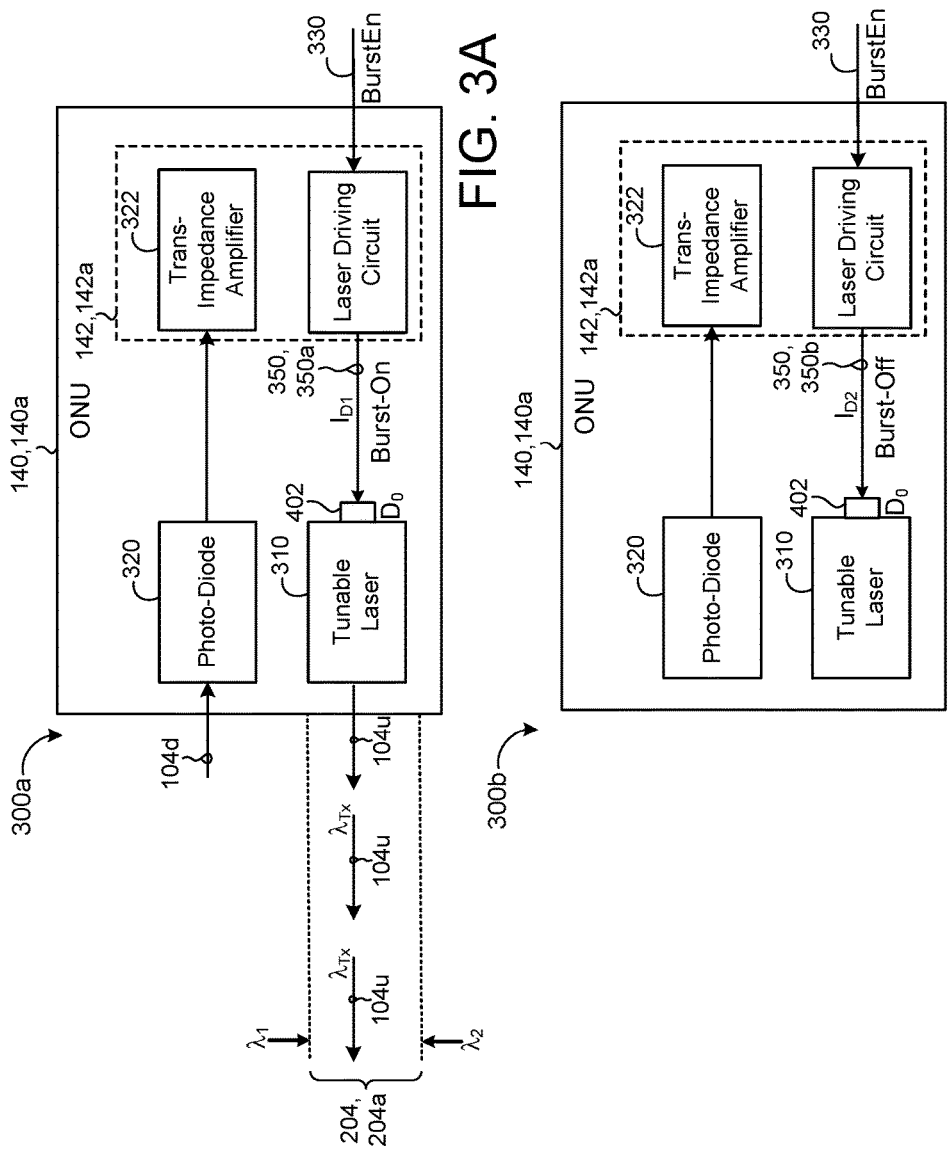

COMMON CATHODE LASER DRIVING CIRCUIT

CROSS REFERENCE TO RELATED APPLICATIONS

This U.S. patent application is a continuation of, and claims priority under 35 U.S.C. § 120 from, U.S. patent application Ser. No. 15/631,594, filed on Jun. 23, 2017. The disclosure of this prior application is considered part of the disclosure of this application and is hereby incorporated by reference in its entirely.

TECHNICAL FIELD

This disclosure relates to common cathode laser driving circuits.

BACKGROUND

Fiber optic communication is an emerging method of transmitting information from a source (transmitter) to a destination (receiver) using optical fibers as the communication channel. WDM-PON is an optical technology for access and backhaul networks. WDM-PON uses multiple different wavelengths over a physical point-to-multipoint fiber infrastructure that contains passive optical components. The use of different wavelengths allows for traffic separation within the same physical fiber. The result is a network that provides logical point-to-point connections over a physical point-to-multipoint network topology. WDM-PON allows operators to deliver high bandwidth to multiple endpoints over long distances. A PON generally includes an optical line terminal located at a service provider central office (e.g., a hub), a remote node connected to the central office by a feeder fiber, and a number of optical network units or optical network terminals, near end users. The remote node demultiplexes an optical signal from the central office and distributes the demultiplexed optical signals to multiple optical network terminals along corresponding distribution fibers. Time-division-multiplexing (TDM) is a method of transmitting and receiving independent signals over a common signal path by using different, non-overlapping time slots. Time wavelength division multiplexing (TWDM) uses both time and wavelength dimensions to multiplex signals. Color-less optical network units (ONUs), which are based on tunable laser and suitable driving topologies, are critical components for flexible WDM/TWDM-PON system architectures. The laser driving circuit in the ONU is the component to generate the upstream optical signal. To meet the WDM/TWDM-PON system requirements, the driving circuit has to guarantee the optical output has not only enough power and modulation magnitudes, but also short burst switching times and minimum wavelength drifts.

SUMMARY

One aspect of the disclosure provides a method for biasing and modulating a tunable laser during burst-on and burst-off states through a common-cathode laser driving circuit. The method includes delivering, by a laser driving circuit, a bias current and a modulation current to an anode of a gain-section diode disposed on a shared substrate of the laser, and receiving, at the laser driving circuit, a burst mode signal indicative of a burst-on state or a burst-off state. When the burst mode signal is indicative of the burst-off state, the method includes sinking, by the laser driving circuit, a sink current away from a biasing current at the anode of the gain-section diode. The sink current is less than the bias current delivered to the anode of the gain-section diode When the burst mode signal transitions to be indicative of the burst-on state from the burst-off state, the method includes, ceasing, by the laser driving circuit, the sinking of the sink current away from bias current delivered to the anode of the gain-section diode, and delivering, by the laser driving circuit, an overshoot current to the anode of the gain-section diode to accelerate heating of the gain diode.

Implementations of the disclosure may include one or more of the following optional features. In some implementations, the gain-section diode receives a diode current equal to the bias current minus the sink current when the burst mode signal is indicative of the burst-off state. The method may further include the laser driving circuit receiving a sink current adjustment from a sinking stage of the laser driving circuit. The sink current adjustment may be configured to adjust the sink current. In some examples, the sinking stage includes a differential pair of first and second metal-oxide-semiconductor field-effect transistors (MOSFETs) each connected to a burst mode signal source. The first MOSFET may be connected to a resistor connected to a voltage source and the second MOSFET may be connected to an inductor connected to the anode of the gain-section diode. In some configurations, the first MOSFET is turned off and the second MOSFET is turned on to sink the sink current away from the anode of the gain-section diode when the burst mode signal is indicative of the burst-off state. On the other hand, the first MOSFET may be turned on and the second MOSFET may be turned off to cease the sinking of the sink current away from the anode of the gain-section diode when the burst mode signal is indicative of the burst-on state.

In some examples, the method further includes delivering, by the laser driving circuit, the overshoot current to the anode of the gain-section diode for a transition period of time after commencement of the burst-on state. In these examples, the transition period of time is less than a burst-on period of time corresponding to a duration of the burst-on state. In other words, the transition period of time may occur over a portion of the duration (i.e., at burst edges) of the burst-on state without the overshoot current. The laser driving circuit may include a heating stage capacitively coupled to the anode of the gain-section diode to deliver the overshoot current to the anode of the gain-section diode. The heating stage may include a metal-oxide-semiconductor field-effect transistor (MOSFET) connected to a burst mode signal source and first and second resistors, wherein a ratio of the first and second resistors is proportional to a magnitude of the overshoot current.

In some implementations, when the burst mode signal is indicative of the burst-on state, the method further includes modulating, by the laser driving circuit, the laser by a capacitively coupled modulation stage of the laser driving circuit to the anode of the gain-section diode, resulting in an alternating current (AC) modulation current. In some examples, the modulation stage includes a differential pair of first and second MOSFETs each connected to a burst mode signal source and a data signal source. The first MOSFET may be connected to a first resistor connected to a voltage source and the second MOSFET may be connected by a capacitor to the anode of the gain-section diode. In some examples, the second MOSFET is connected to a second resistor connected to a tunable voltage source. The laser may include a multi-section distributed Bragg reflector (DBR) laser or any multi-section tunable laser.

Another aspect of the disclosure provides a common-cathode laser driving circuit for biasing and modulating a tunable laser during burst-on and burst-off states. The laser driving circuit includes a gain-section diode having a shared substrate with the laser and an anode configured to receive a bias current and a modulation current. The laser driving circuit further includes a sinking stage configured to receive a burst mode signal indicative of a burst-on state or a burst-off state. When the burst mode signal is indicative of the burst-off state, laser driving circuit is configured to sink a sink current away from the anode of the gain-section diode. The sink current is less than the bias current received by the anode of the gain-section diode. When the burst mode signal is indicative of the burst-on state, the sinking stage is configured to cease the sinking of the sink current away from the anode of the gain-section diode. The laser driving circuit further includes a heating stage configured to deliver an overshoot current to the anode of the gain-section diode to accelerate heating of the gain-section diode when the burst mode signal is indicative of the burst-on state.

This aspect may include one or more of the following optional features. In some implementations, the gain-section diode receives a diode current equal to the bias current minus the sink current when the burst mode signal is indicative of the burst-off state. In some examples, the sinking stage includes a differential pair of first and second metal-oxide-semiconductor field-effect transistors (MOSFETs) each connected to a burst mode signal source. The first MOSFET may be connected to a resistor connected to a voltage source and the second MOSFET may be connected to an inductor connected to the anode of the gain-section diode. In some configurations, the first MOSFET is turned off and the second MOSFET is turned on to sink the sink current away from the anode of the gain-section diode when the burst mode signal is indicative of the burst-off state. On the other hand, the first MOSFET may be turned on and the second MOSFET may be turned off to cease the sinking of the sink current away from the anode of the gain-section diode when the burst mode signal is indicative of the burst-on state.

In some examples, the heating stage delivers the overshoot current to the anode of the gain-section diode for a transition period of time after commencement of the burst-on state. In these examples, the transition period of time is less than a burst-on period of time corresponding to a duration of the burst-on state. The heating stage may be capacitively coupled to the anode of the gain-section diode to deliver the overshoot current to the anode of the gain-section diode. The heating stage may include a metal-oxide-semiconductor field-effect transistor (MOSFET) connected to a burst mode signal source and first and second resistors, wherein a ratio of the first and second resistors is proportional to a magnitude of the overshoot current.

In some implementations, the laser driving circuit further includes a modulation stage capacitively coupled to the anode of the gain-section diode and configured to modulate the anode of the gain-section diode with an alternating current (AC) modulation current when the burst mode signal is indicative of the burst-on state. In some examples, the modulation stage includes a differential pair of first and second MOSFETs each connected to a burst mode signal source and a data signal source. The first MOSFET may be connected to a first resistor connected to a voltage source and the second MOSFET may be connected by a capacitor to the anode of the gain-section diode. In some examples, the second MOSFET is connected to a second resistor connected to a variable voltage source. The laser may include a multi-section tunable laser such as, but not limited to, a multi-section distributed Bragg reflector (DBR) laser.

The details of one or more implementations of the disclosure are set forth in the accompanying drawings and the description below. Other aspects, features, and advantages will be apparent from the description and drawings, and from the claims.

DESCRIPTION OF DRAWINGS

FIGS. 3A and 3B are schematic views of an optical network unit configured to suppress wavelength drift when switching between operation in a burst-on state and a burst-off state.

Like reference symbols in the various drawings indicate like elements.

DETAILED DESCRIPTION

Figure 1:
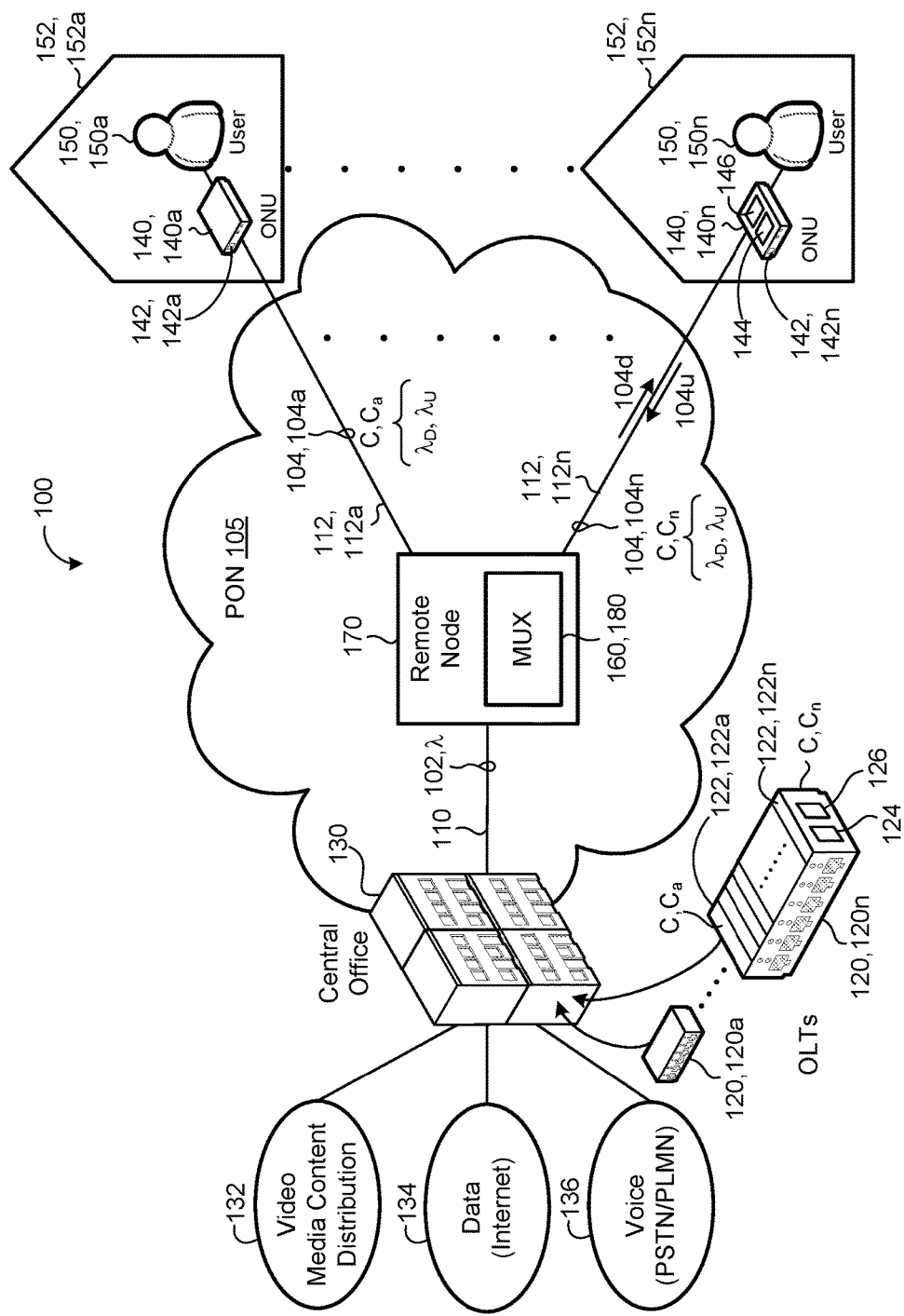
FIG. 1 is a schematic view of an example communication system.

Referring to FIG. 1, an optical communication system 100 delivers communication signals 102 (e.g., optical signals) through communication links 110, 112, 112*a-n* (e.g., optical fibers or line-of-sight free space optical communications) between an optical line terminal (OLT) 120 housed in a central office (CO) 130 and optical network units (ONUs) 140, 140*a-n* (e.g., a bidirectional optical transceiver) associated with users 150, 150*a-n* (also referred to as customers or subscribers). The ONUs 140, 140*a-n* are typically located at premises 152, 152*a-n* of the users 150, 150*a-n*.

Customer premises equipment (CPE) is any terminal and associated equipment located at the premises 152 of the user 150 and connected to a carrier telecommunication channel C at a demarcation point ("demarc"). In the examples shown, the ONU 140 is a CPE. The demarc is a point established in a house, building, or complex to separate customer equipment from service provider equipment. CPE generally refers to devices such as telephones, routers, switches, residential gateways (RG), set-top boxes, fixed mobile convergence products, home networking adapters, or Internet access gateways that enable the user 150 to access services of a communications service provider and distribute them around the premises 152 of the user 150 via a local area network (LAN).

In some implementations, the optical communication system 100 implements an optical access network 105, such as a passive optical network (PON) 105, for example, for access and mobile fronthaul/backhaul networks. In some examples, the optical communication system 100 implements a point-to-point (pt-2-pt) PON having direct connections, such as optical Ethernets, where a home-run optical link 110, 112 (e.g., fiber) extends all the way back to an OLT 120 at the CO 130 and each customer 150, 150a-n is terminated by a separate OLT 120a-n. In other examples, the optical communication system 100 implements a point-to-multi-point (pt-2-multi-pt) PON, where a shared OLT 120 services multiple customers 150, 150a-n.

The CO 130 includes at least one OLT 120 connecting the optical access network 105 to an Internet Protocol (IP), Asynchronous Transfer Mode (ATM), or Synchronous Optical Networking (SONET) backbone, for example. Therefore, each OLT 120 is an endpoint of the PON 105 and converts between electrical signals used by service provider equipment and optical signals 102 used by the PON 105. Each OLT 120, 120a-n includes at least one transceiver 122, 122a-n, depending on the implementation of the optical access network 105. The OLT 120 sends the optical signal 102 via a corresponding transceiver 122, through a feeder fiber 110 to a remote node (RN) 170, which includes a band-multiplexer 160 configured to demultiplex the optical signal 102 and distribute demultiplexed optical signals 104 to multiple users 150, 150a-n along corresponding distribution fibers 112, 112a-n. The band-multiplexer 160 for multiplexing/demultiplexing may be an arrayed wavelength grating 180 (AWG), which is a passive optical device. In some examples, each CO 130 includes multiple OLTs 120, 120a-n, and each OLT 120 is configured to service a group of users 150. In addition, each OLT 120 may be configured to provide signals in different services, e.g., one OLT 120 may provide services in 1G-PON, while another OLT 120 provides services in 10G-PON.

As shown in FIG. 1, the CO 130 multiplexes signals received from several sources, such as a video media distribution source 132, an Internet data source 134, and a voice data source 136, and multiplexes the received signals into one multiplexed signal 102 before sending the multiplexed optical signal 102 to the RN 170 through the feeder fiber 110. The multiplexing may be performed by the OLT 120 or a broadband network gateway (BNG) positioned at the CO 130. Typically, services are time-division-multiplexed on the packet layer.

Time-division-multiplexing (TDM) is a method of transmitting and receiving independent signals over a common signal path by using different, non-overlapping time slots. Wavelength division multiplexing (WDM) uses multiple wavelengths λ to implement point-to-multi-point communications in the PON 105. The OLT 120 serves multiple wavelengths through one fiber 110 to the band-multiplexer 160 at the RN 170, which multiplexes/demultiplexes signals between the OLT 120 and a plurality of ONUs 140, 140a-n. Multiplexing combines several input signals and outputs a combined signal. Time wavelength division multiplexing (TWDM) uses both time and wavelength dimensions to multiplex signals.

For WDM and dense-WDM (DWDM), the OLT 120 includes multiple optical transceivers 122, 122a-n. Each optical transceiver 122 transmits signals at one fixed wavelength $\lambda_D$ (referred to as a downstream wavelength) and receives optical signals 102 at one fixed wavelength $\lambda_U$ (referred to as an upstream wavelength). The downstream and upstream wavelengths $\lambda_D$, $\lambda_U$ may be the same or different. Moreover, a channel C may define a pair of downstream and upstream wavelengths $\lambda_D$, $\lambda_U$, and each optical transceiver 122, 122-n of a corresponding OLT 120 may be assigned a unique channel $C_{a-n}$.

The OLT 120 multiplexes/demultiplexes the channels C, $C_{a-n}$ of its optical transceivers 122, 122a-n for communication of an optical signal 102 through the feeder fiber 110. Whereas, the band-multiplexer 160 at the RN 170 multiplexes/demultiplexes optical signals 102, 104, 104-n between the OLT 120 and a plurality of ONUs 140, 140a-n. For example, for downstream communications, the band-multiplexer 160 demultiplexes the optical signal 102 from the OLT 120 into ONU optical signals 104, 104a-n, i.e., downstream optical signals 104d, for each corresponding ONU 140, 140a-n. For upstream communications, the band-multiplexer 160 multiplexes ONU optical signals 104, 104a-n from each corresponding ONU 140, 140a-n, i.e., upstream optical signals 104u, into the optical signal 102 for delivery to the OLT 120. To make the transmission successful, the optical transceivers 122, 122a-n of the OLT 120 match with the ONUs 140, 140a-n one-by-one. In other words, the downstream and upstream wavelengths $\lambda_D$, $\lambda_U$ (i.e., the channel C) of respective downstream and upstream optical signals 104d, 104u to and from a given ONU 140 matches the downstream and upstream wavelengths $\lambda_D$, $\lambda_U$ (i.e., the channel C) of a corresponding optical transceiver 122.

In some implementations, each ONU 140, 140a-n includes a corresponding tunable ONU transceiver 142, 142a-n (e.g., that includes a laser or light emitting diode) that can tune to any wavelength λ used by a corresponding OLT 120 at a receiving end. The ONU 140 may automatically tune the tunable ONU transceiver 142 to a wavelength λ that establishes a communication link between the corresponding OLT 120 and the ONU 140. Each optical transceiver 122, 142 may include data processing hardware 124, 144 (e.g., control hardware, circuitry, field programmable gate arrays (FPGAs, etc.) and memory hardware 126, 146 in communication with the data processing hardware 124, 144. The memory hardware 126, 146 may store instructions (e.g., via firmware) that when executed on the data processing hardware 124, 144 cause the data processing hardware 124, 144 to perform operations for auto-tuning the optical transceiver 122, 142. In some configurations, the tunable ONU transceiver 142 includes a laser driving circuit 400 (FIG. 4) configured to continuously provide a current to a tunable laser 310 in a burst-on state (FIG. 3A) and a burst-off state (FIG. 3B). The ONU 140 may include a photodetector that converts the optical wave to an electrical form. The electrical signal may be further de-multiplexed down to subcomponents (e.g., data over a network, sound waves converted into currents using microphones and back to its original physical form using speakers, converting images converted into currents using video cameras and converting back to its physical form using a television). Additional details on auto-tuning the ONU 140 to communicate with the corresponding OLT 120 can be found in U.S. patent application Ser. No. 15/354,811, filed on Nov. 17, 2016, which is hereby incorporated by reference in its entirety.

Figure 2:
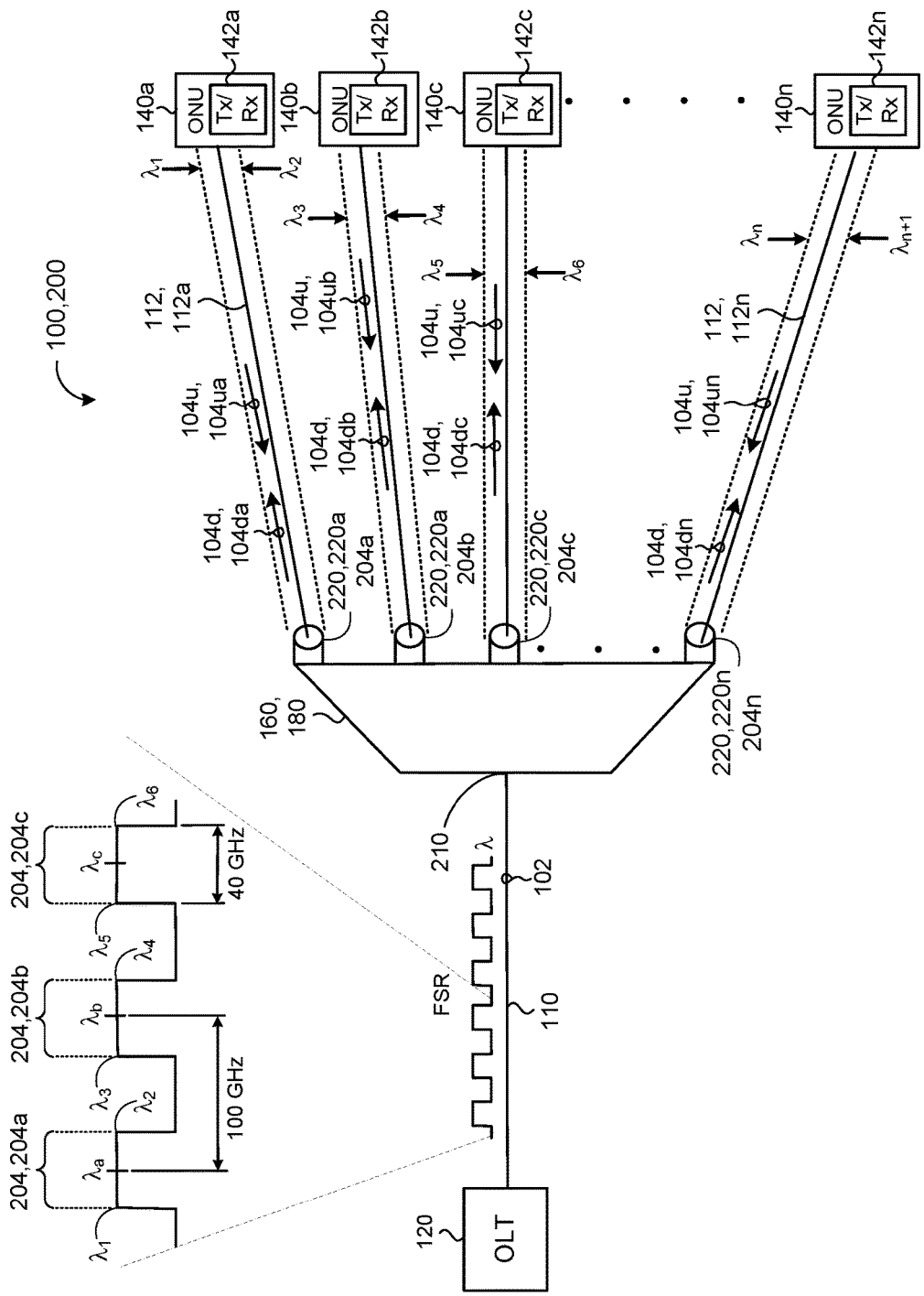
FIG. 2 is a schematic view of an example dense-wavelength division multiplexing architecture for a communication system.

FIG. 2 illustrates an example DWDM architecture 200 for the communication system 100 that facilitates user aggregation onto a single strand of fiber 110, 112, 112a-n. An exemplary arrayed waveguide grating 180 (AWG), which may be used as a band-multiplexer 160, is optically coupled to the OLT 120 and a plurality of ONUs 140, 140a-n. The AWG 180 may be used to demultiplex an optical signal 102 through the feeder fiber 110 from the OLT 120 into downstream ONU optical signals 104d, 104da-104dn of several different wavelengths λ for each corresponding ONU 140, 140a-n. The AWG 180 may reciprocally multiplex upstream ONU optical signals 104u, 104ua-104un of different wavelengths λ from each ONU 140 into a single optical feeder fiber 110, whereby the OLT 120 receives the multiplexed optical signal 104 through the feeder fiber 110. The AWG 180 includes a multiplex port 210 optically coupled to the OLT 120 and a plurality of demultiplex ports 220, 220a-n. Each demultiplex port 220 is optically coupled to a corresponding ONU 140 of the plurality of ONUs 140, 140a-n. In some examples, the AWG 180 is disposed at the RN 170. In other examples, the AWG 180 is disposed OLT 120, or more specifically, co-located with the OLT 120 at the CO 130.

The AWG 180 is cyclic in nature. The wavelength multiplexing and demultiplexing property of the AWG 180 repeats over periods of wavelengths called free spectral range (FSR). Multiple wavelengths, separated by the FSR, are passed through the AWG 180 from each demultiplex port 220 to the multiplex port 210. In the example shown, each of the multiple wavelengths λ of the FSR are separated by about 100 Gigahertz (GHz) with a wavelength pass-band 204 of about 40 GHz. For instance, first, second, and third wavelengths $\lambda_a, \lambda_b, \lambda_c$ are each separated by 100 GHz and associated with a corresponding wavelength pass-band 204, 204a-c of about 40 GHz. However, in other configurations, the wavelength pass-band 204 may be greater than or equal to 40 GHz. The wavelength pass-band 204a associated with wavelength $\lambda_a$ is defined by lower and upper wavelength limits $\lambda_1, \lambda_2$, the wavelength pass-band 204b associated with wavelength $\lambda_b$ is defined by upper and lower wavelength limits $\lambda_3, \lambda_4$, and the wavelength pass-band 204c associated with wavelength $\lambda_c$ is defined by upper and lower wavelength limits $\lambda_5, \lambda_6$. The wavelength pass-bands 204 may be separated by a range of wavelengths associated with a stop-band. In the example shown, a stop-band is defined between the upper wavelength limit $\lambda_2$ of the wavelength pass-band 204a and the lower wavelength limit $\lambda_3$ of the wavelength pass-band 204b, and another stop-band is defined between the upper wavelength limit $\lambda_4$ of the wavelength pass-band 204b and the lower wavelength limit $\lambda_5$ of the wavelength pass-band 204c.

In some implementations, each demultiplex port 220, 220a-n of the AWG 180 is associated with a corresponding one of the wavelength pass-bands 204, 204a-n. Here, the AWG 180 is configured to allow passage therethrough of each upstream optical signal 104u having a wavelength within the wavelength pass-band 204 associated with the corresponding demultiplex port 220. However, for any upstream optical signals 104u having a wavelength outside the wavelength pass-band 204 associated with the corresponding demultiplex port 220, the AWG 180 is configured to block the passage therethrough of those upstream optical signals 104u. In the example shown, the ONU transceiver 142a of the ONU 140a transmits a corresponding optical signal 104ua at a wavelength within the wavelength pass-band 204a of the corresponding demultiplex port 220a. For instance, the wavelength of the optical signal 104ua is greater than the lower wavelength limit $\lambda_1$ and less than the upper wavelength limit $\lambda_2$ of the wavelength pass-band 204a. Similarly, each ONU transceiver 142b-n of the ONUs 140b-n transmits a corresponding optical signal 104ub-104un at a corresponding wavelength within the wavelength pass-band 204b-n associated with the corresponding demultiplex port 220b-n.

Generally, to avoid crosstalk at the OLT 120, only one ONU 140 transmits upstream optical signals 104u to the OLT 120 at a time. The ONU transceivers 142 include a transmitter 310 (FIGS. 3A and 3B), usually a semiconductor laser, configured to transmit upstream optical signals 104u to the OLT 120 in a burst-on state. Turning off the laser 310 to cease transmission of the optical signals 104u to the OLT 120 when not in use causes the temperature of the laser 310 to cool. The laser 310 is once again heated when turned on to transmit a subsequent upstream optical signal 104u. The thermal fluctuation caused by the repeated heating and cooling results in wavelength drift each time the laser is turned on. In some examples, the wavelength of the optical signals 104u drift out of the wavelength pass-band 204 associated with the band-multiplexer 160, 180, thereby resulting in the band-multiplexer 160, 180 blocking the passage there through of the optical signals 104u to the OLT 120.

Referring to FIGS. 3A and 3B, in some implementations, the ONU transceiver 142, 142a of the ONU 140, 140a of the communication system 100 includes a laser driving circuit 400 for a tunable laser 310 configured to suppress wavelength drift when switching between operation in a burst-on state (FIG. 3A) and a burst-off state (FIG. 3B). Referring to FIG. 3A, the schematic view 300a shows the ONU 140 tuning the tunable laser 310 while in the burst-on state to transmit the optical signal 104u at the transmit wavelength $\lambda_{Tx}$ within the wavelength pass-band 204, 204a of the band-multiplexer 160 (e.g., AWG 180). The band-multiplexer 160 is configured to allow passage therethrough of the optical signal 104u at the transmit wavelength $\lambda_{Tx}$.

The band-multiplexer 160 may include the AWG 180 having the corresponding demultiplex port 220, 220a associated with the wavelength pass-band 204, 204a defined by the upper and lower wavelength limits $\lambda_1, \lambda_2$. The ONU transceiver 142 also includes a trans-impedance amplifier (TIA) 322 configured to receive downstream optical signals 104d through a photo-diode 320 from the OLT 120 that have been demultiplexed by the band-multiplexer 160. The data processing hardware (e.g., control hardware) 144, 144a of the ONU 140 implements a common-cathode laser driving circuit 400 with alternating current (AC) coupling that electrically couples electrical signals to the tunable laser 310 to enable fast switching between the burst-on and burst-off states and minimize wavelength drifts. For instance, the laser driving circuit 400 may deliver a burst-on current 350, 350a to the tunable laser 310 to operate the laser 310 in the burst-on state and may deliver a burst-off current 350, 350b to the tunable laser 310 to operate the tunable laser 310 in the burst-off state. In some configurations, the tunable laser 310 includes a multi-section structure with each section/structure sharing a single substrate. For example, the laser 310 may include a tunable distributed Bragg reflector (DBR) laser having a DBR section, phase section, and a gain section on a same substrate. Each section has a P-doped Indium phosphide (InP) region on a shared N-doped InP substrate which forms a corresponding diode ($D_0, D_1, D_2$) with a common cathode. These diodes may be driven by corresponding injection currents ($I_{GAIN}, I_{PHASE}, I_{DBR}$). The laser 310 is not limited to DBR lasers and may correspond to any multi-section tunable laser 310. The gain-section diode $D_0$ 402 is configured to receive a diode current $I_{D1}, I_{D2}$ (e.g., injection current 350, 350a-b) for biasing the laser 310 to a wavelength determined and tuned by the current magnitudes ($I_{DBR}$, $I_{PHASE}$) at the DBR section and the phase section.

In some examples, the laser driving circuit 400 receives a burst mode signal (BurstEn) 330 indicative of the burst-on state to deliver the burst-on current 350a to the tunable laser 310 (i.e., deliver a first diode current $I_{D1}$ to the anode of the gain-section diode $D_0$ 402). The burst-on current 350a may bias the tunable laser 310 to transmit the optical signal 104u at the transmit wavelength $\lambda_{Tx}$ within the wavelength passband 204 of the band-multiplexer 160. The burst-on current 350a may correspond to a bias current ($I_{BIAS}$) and an alternating current (AC) modulation current ($I_{MOD}$).

Referring to FIG. 3B, the schematic view 300b shows the ONU 140a tuning the tunable laser 310 in the burst-off state to cease transmission of the optical signal 104u to the OLT 120. While in the burst-off state, the laser 310 is not lasing or is only producing an optical power output of low magnitude insufficient for receipt by the receiver sensitivity at the OLT 120. In some implementations, the laser driving circuit 400 receives the burst mode signal (BurstEn) 330 indicative of the burst-off state to deliver the burst-off current 350b to the tunable laser 310. The burst-off current 350b is less than the burst-on current 350a and may bias the tunable laser 310 to cease transmission of the optical signal 104u at the transmit wavelength $\lambda_{Tx}$ within the wavelength pass-band 204.

During the burst-off state, the laser driving circuit 400 delivers the burst-off current 350b to the tunable laser 310 (i.e., delivers a second diode current $I_{D2}$ to the anode of the gain-section diode $D_0$ 402) to keep the laser warm during the burst-off state. Here, the burst-off current 350b (i.e., the second diode current $I_{D2}$ delivered to the anode of the gain-section diode $D_0$ 402) corresponds to a difference between the bias current ($I_{BIAS}$) and a sink current ($I_{SINK}$) sinking a portion of the $I_{BIAS}$ away from the anode of the gain-section diode $D_0$ 402. Accordingly, the laser 310 is continuously heated by the reduced burst-off current 350b (i.e., difference between $I_{BIAS}$ and $I_{SINK}$) during the burst-off state. Thus, rather than un-powering the laser 310 entirely by sinking all the bias current ($I_{BIAS}$) or grounding the anode of the gain-section diode $D_0$ 402 to zero to cease transmission of the optical signal 104u to the OLT 120, and thereby cause cooling of the laser 310, the gain-section diode $D_0$ 402 is configured to receive the burst-off current 350b to heat the tunable laser 310, while at the same time ceasing transmission of the optical signal 104u to the OLT 120. The continuous heating of the tunable laser 310 by the burst-off current 350b while in the burst-off state decreases thermal fluctuations at the laser 310, and thereby substantially inhibits large wavelength drifts from occurring when the ONU 140 is commanded to subsequently transmit data in the optical signal 104u for receipt by the OLT 120.

Figure 3C:
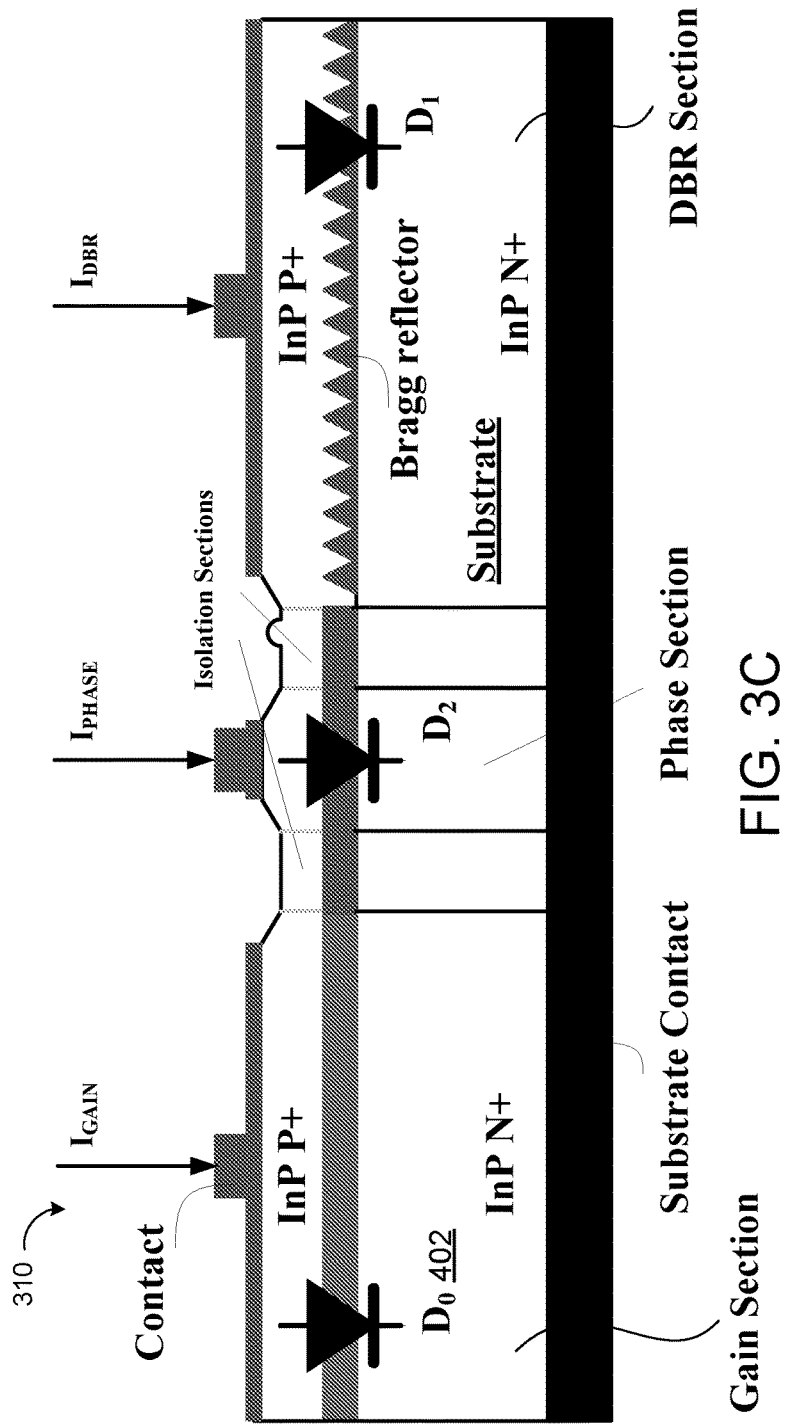
FIG. 3C is a schematic view of an example multi-section tunable laser.

FIG. 3C provides an example fully-tunable laser 310 for use in burst mode operations in WDM-PON applications. The laser 310 may include a multi-section structure having a gain section, a DBR section, and a phase section. Generally, wavelength tuning is through refractive index changes of a Bragg reflector by adjustment of DBR injection currents ($I_{DBR}$) at the DBR section. The phase section may provide adjustable phase shifts for fine-turning the wavelength through a phase injection current ($I_{PHASE}$). In some implementations, temperature control may be also used to fine-tune the wavelength.

The gain section may provide two functions: (1) generating a suitable optical power for achieving the transmission distance of the optical signal 104u to the OLT 120; and generating information carried by the wavelength. The driving circuit 400 may provide these functions through implementation of the biasing current and the modulation current, denoted as $I_{GAIN}$ in the example shown. The biasing current generates output power and the modulation current adds the information to the carrier wavelength.

In the example shown, each section has P doping anodes (InP P+) with N doping (InP N+) shared-substrate as the cathode, which is normally grounded during the application. The diodes ($D_0$, $D_1$, $D_2$) for the DBR tunable laser 310 all share the same cathode for circuit behaviors. While low-speed programmable digital to analog converters (DACs) can provide $I_{DBR}$ and $I_{PHASE}$, the laser driving circuit 400 is used for providing $I_{GAIN}$ through a common-cathode topology with the capability to provide both the biasing current and the high-speed modulation current. The WDM-PON requires the laser 310 to have stable wavelength and fast ON_OFF times during burst operations. Reducing the wavelength drift and speeding up burst operations with an improved laser driving circuit design, rather than optical technology improvement, provides reduced costs.

Figure 4:
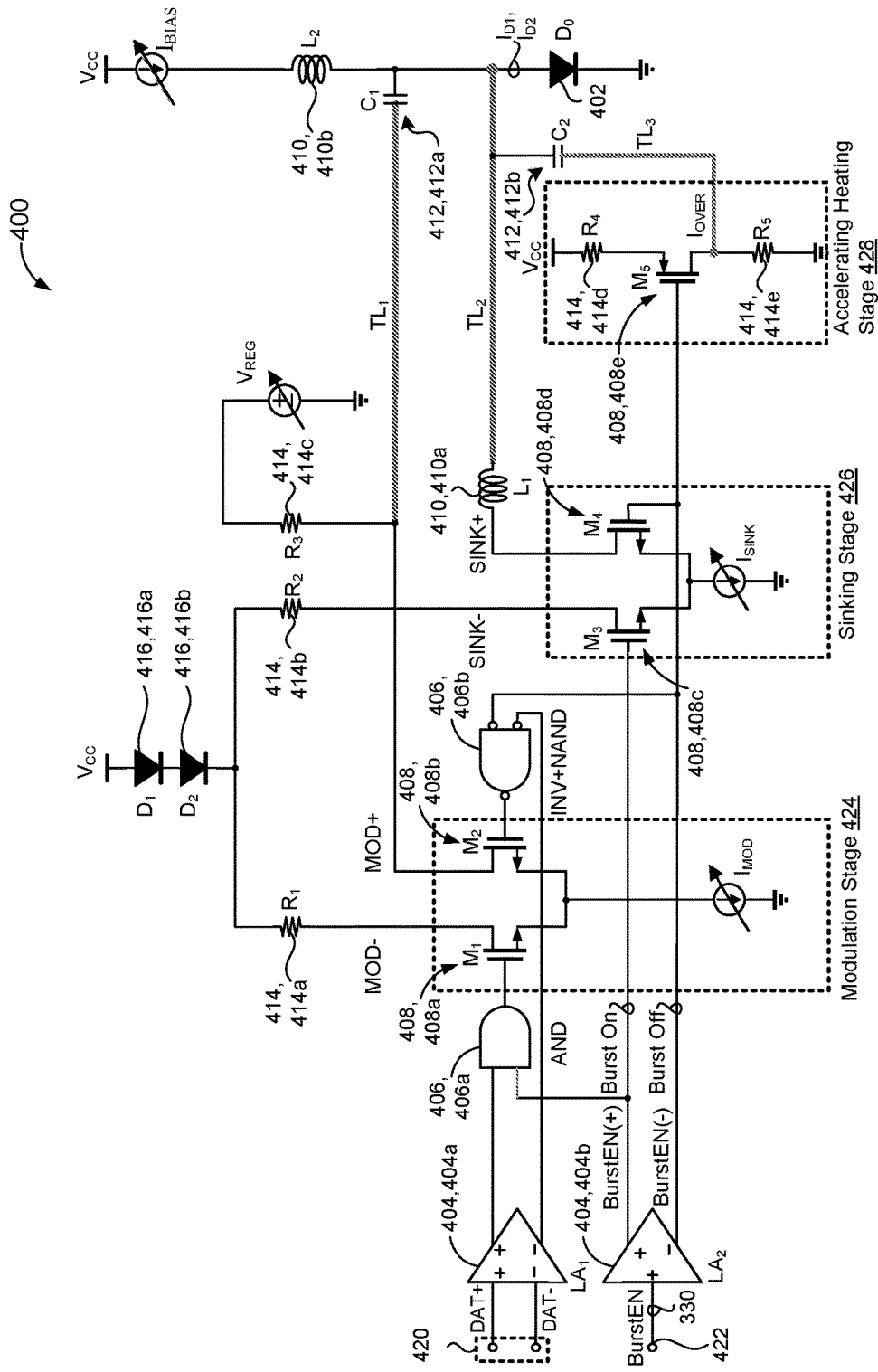
FIG. 4 is a schematic view of an example common-cathode laser driving circuit for use in a fully-tunable optical network unit (ONU).

FIG. 4 provides a schematic view of the common-cathode laser driving circuit 400 for use in a fully-tunable ONU 140. The circuit 400 is configured to deliver the first or second diode currents $I_{D1}$, $I_{D2}$ to the anode of the gain-section diode $D_0$ 402 disposed on the shared substrate of the multi-section tunable laser 310. A cathode-side of the gain-section diode $D_0$ 402 is grounded while the anode-side of the gain-section diode $D_0$ 402 is connected to a voltage source $V_{CC}$ that delivers the bias current $I_{BIAS}$ to the anode of the gain-section diode $D_0$ 402. Here, the magnitude of the $I_{BIAS}$ delivered to the diode $D_0$ 402 determines the optical power of the laser 310 for transmitting optical signals 104u at the at the transmit wavelength $\lambda_{Tx}$ within the wavelength pass-band 204 in the burst-on state. The circuit 400 includes a pair of limiting amplifiers ($LA_1$, $LA_2$) 404, 404a-b, high speed logic gates 406, 406a-b, metal-oxide-semiconductor field-effect transistors (MOSFETs) 408, 408a-e, inductors ($L_1$, $L_2$) 410, 410a-b, capacitors ($C_1$, $C_2$) 412, 412a-b, resistors ($R_1$-$R_5$) 414, 414a-e, and diodes ($D_1$, $D_2$) 416, 416a-b. The diodes ($D_1$, $D_2$) 416, 416a-b may be driven by low-speed DACs. In some implementations, the circuit 400 may use Bipolar Junction Transistors (BJTs) instead of the MOSFETs 408 to perform switching operations.

The first limiting amplifier ($LA_1$) 404a receives input data signals DAT+, DAT− providing data information from a data signal source 420 and amplifies the input data signals DAT+, DAT−. In the example shown, the $LA_1$ 404a corresponds to a differential-in differential-out limiting amplifier for amplifying the differential input data signals DAT+, DAT− from the data signal source 420 at the burst-on mode. At the burst-off mode, the input data signals DAT+, DAT− are blocked by the high-speed logic gates 406, 406a-b, so that a modulation stage 424 is disabled. The second limiting amplifier ($LA_2$) 404b receives the burst mode signal (BurstEN) 330 indicative of the burst-on state (FIG. 3A) or the burst-off state (FIG. 3B) from a burst mode signal source 422 and amplifies the BurstEN 330. In the example shown, the $LA_2$ 404b corresponds to a single-ended-in differential-out limiting amplifier for amplifying the BurstEN 330 from the burst mode signal source 422.

The high speed logic gates 406a-b are each connected to the outputs of the limiting amplifiers $LA_1$ 404a, $LA_2$ 404b and are configured to output control signals to control the modulation stage 424. Based on the BurstEN 330, the modulation stage 424 of the laser driving circuit 400 may capacitively couple/decouple the electrical signals to/from the anode of the gain-section diode $D_0$ 402. In the example shown, the logic gate 406a includes a high-speed AND gate having a first input associated with the data signal DAT+ output from the $LA_1$ 404a, a second input associated with a BurstEN(+) output from the $LA_2$ 404b, and an output connected to a first MOSFET ($M_1$) 408a. The BurstEN(+) input to the AND gate 406a is true when the BurstEN is indicative of the burst-on state and false when the BurstEN is indicative of the burst-off state. Accordingly, the AND gate 406a passes a positive modulation data signal associated with the input data signal DAT+ to the $M_1$ 408a when the BurstEN(+) is true, thereby indicating that the data signal source 420 is providing data information and the burst mode signal 330 is indicative of the burst-on state. When burst mode signal 330 is indicative of the burst-off state, the BurstEN(+) output from the $LA_2$ 404b is logically low and the positive modulation data signal associated with the input data signal DAT+ is by-passed by the AND gate 406a. The first $M_1$ 408a is also connected to the first resistor $R_1$ 414a and the first resistor $R_1$ 414a is connected to the voltage source $V_{CC}$.

Moreover, the logic gate 406b includes two high-speed inverters and a high-speed NAND (INV+NAND) gate having a first input associated with the input data signal DAT− output from the $LA_1$ 404a, a second input associated with a BurstEN(−) output from the $LA_2$ 404b, and an output connected to a second MOSFET ($M_2$) 408b. The BurstEN (−) input to the INV+NAND gate 406b is true when the BurstEN 330 is indicative of the burst-off state and false when the BurstEN 330 is indicative of the burst-on state. Accordingly, the INV+NAND gate 406b may pass a negative modulation data signal associated with the input data signal DAT− to the $M_2$ 408b when the BurstEN(−) is false, thereby indicating that the data signal source 420 is providing data information and the burst mode signal 330 is indicative of the burst-on state. When burst mode signal 330 is indicative of the burst-off state, the BurstEN(−) output from the $LA_2$ 404b is logically low after passing the INV of the gate 406b and the negative modulation data signal associated with the input data signal DAT+ is by-passed by the NAND of the gate 406b. The second $M_2$ 408b is further capacitively connected by the first capacitor $C_1$ 412a to the anode of the gain-section diode $D_0$ 402 via a first transmission line $TL_1$. In some examples, the second $M_2$ 408b is also connected to the third resistor $R_3$ 414c and the third resistor $R_3$ 414c is connected to a regulated voltage source ($V_{REG}$).

The laser driving circuit 400 further includes a sinking stage 426 including a differential pair of third and fourth MOSFETs $M_3$ 408c, $M_4$ 408d each connected to the burst mode signal source 422. The third $M_3$ 408c is connected to the second resistor $R_2$ 414b and the second resistor $R_2$ 414b is connected to the voltage source $V_{CC}$. The fourth $M_4$ 408d is connected to the first inductor $L_1$ 410a that is connected to the anode of the gain-section diode $D_0$ 402 via a second transmission line $TL_2$.

When the BurstEN 330 is indicative of the burst-on state (i.e., BurstEN(+) is true and BurstEN(−) is false), the third $M_3$ 408c is turned ON and the fourth $M_4$ 408d is turned OFF. Under this scenario, the sinking stage 426 does not sink any current and the gain-section diode $D_0$ 402 receives a first diode current $I_{D1}$ equal to the bias current $I_{BIAS}$ delivered to the anode side of the gain-section diode $D_0$ 402. The first diode current $I_{D1}$ may correspond to an average of the burst-on current 350a (FIG. 3A) delivered to the laser 310 for transmitting optical signals 104u at the transmit wavelength $\lambda_{Tx}$, and thereby sets the transmit optical power (e.g., output power) of the ONU 140. The bias current $I_{Bias}$ is implemented with a programmable capability to provide flexibility for adjusting the output power of the ONU 140. In some examples, the second inductor $L_2$ 410b shields parasitic losses from the bias current $I_{BIAS}$.

Moreover, the modulation stage 424 is capacitively coupled to the anode of the gain-section diode $D_0$ 402 when the BurstEN 330 is indicative of the burst-on state. The modulation stage 424 is configured to modulate the gain-section diode $D_0$ 402 with a modulation current $I_{MOD}$ that includes the data information associated with the input data signals DAT+, DAT−. The modulation current $I_{MOD}$ is implemented with a programmable capability to provide flexibility for adjusting a magnitude of the output optical signal 104u. Specifically, as the second $M_2$ 408b is capacitively connected by the first capacitor $C_1$ 412a to the anode of the gain-section diode $D_0$ 402, the modulation current $I_{MOD}$ (MOD+) output from the modulation stage 424 is AC-coupled to the anode of the gain-section diode $D_0$ 402 so that the optical power of the laser 310 is based solely on the magnitude of the bias current $I_{BIAS}$. By AC-coupling the modulation current $I_{MOD}$ (MOD+) to the anode of the gain-section diode $D_0$ 402, the optical power of the ONU 140 only depends on the bias current $I_{BIAS}$, and thereby simplifies an optical power calibration process when mass producing ONU 140 modules. In some examples, a transmission line $TL_1$ is disposed between the modulation stage 424 and the anode of the gain-section diode $D_0$ 402 for signal integration considerations at high-speed modulation applications. In some examples, the $V_{REG}$ is optimized to set the DC voltage of the modulation stage 424 output (MOD+) to minimize the voltages of the first capacitor $C_1$ 412a during the burst-on and burst-off states. Accordingly, the $V_{REG}$ may reduce the burst-on and burst-off times caused by the voltage settling time of the first capacitor $C_1$ 412a.

On the other hand, when the BurstEN 330 is indicative of the burst-off state (i.e., BurstEN(+) is false and BurstEN(−) is true), the third $M_3$ 408c is turned OFF and the fourth $M_4$ 408d is turned ON. Here, the sinking stage 426 is configured to sink the sink current $I_{SINK}$ (SINK+) away from the bias current $I_{BIAS}$ at the anode of the gain-section diode $D_0$ 402. In some examples, a transmission line $TL_2$ is disposed between the sinking stage 426 and the anode of the gain-section diode $D_0$ 402 for signal integration considerations at high-speed modulation. Accordingly, the gain-section diode $D_0$ 402 receives a second diode current $I_{D2}$ equal to the bias current $I_{BIAS}$ minus the sink current $I_{SINK}$. As the second diode current $I_{D2}$ is less than the first diode current hi, the optical power of the laser 310 is reduced to thereby bias the laser 310 to cease transmission of the optical signal 104u to the OLT 120, while at the same time applying heat on the laser 310. The sink current $I_{SINK}$ may be programmable to provide trade-off flexibility between output power and heating strength.

Moreover, the high speed logic gates 406a-b (e.g., AND and INV+NAND gates) are configured to disable the data information associated with the input data signals DAT+, DAT− by decoupling the modulation stage 424 from the anode of the gain-section diode $D_0$ 402 when the BurstEN 330 is indicative of the burst-off state (i.e., BurstEN(+) is false and BurstEN(−) is true). Accordingly, as the sinking stage 426 is sinking the sink current $I_{SINK}$ (SINK+) away from the gain-section diode $D_0$ 402 via the second transmission line $TL_2$ during the burst-off stage, the modulation stage 424 is decoupled from the anode of the gain-section diode $D_0$ 402, and is therefore not providing any modulation current $I_{MOD}$ (MOD+) via the first transmission line $TL_1$ to the $I_{BIAS}$ at the AC-coupling point.

In some implementations, when the BurstEN 330 transitions from the indication of the burst-off state to the indication of the burst-on state, the laser driving circuit 400 ceases the sinking of the sink current $I_{SINK}$ (SINK+) away from the anode of the gain-section diode $D_0$ 402 by turning the third $M_3$ 408c ON and turning the fourth $M_4$ 408d OFF. During the transition, the laser driving circuit 400 may further deliver an overshoot current $I_{OVER}$ to the anode of the gain-section diode $D_0$ 402 to accelerate heating of the gain-section diode $D_0$ 402. In the example shown, the laser driving circuit 400 delivers the overshoot current $I_{OVER}$ by an accelerating heating stage 428 capacitively coupled to the anode of the gain-section diode $D_0$ 402. In some implementations, the heating stage 428 includes a fifth MOSFET ($M_5$) 408e connected to the burst mode signal source 422 via the $LA_2$ 404b and to the anode of the gain-section diode $D_0$ 402 by a second capacitor $C_2$ 412b along a third transmission line $TL_3$. The fifth $M_5$ 408e is further connected to the fourth resistor $R_4$ 414d and the fifth resistor $R_5$ 414e. The fourth resistor $R_4$ 414d is connected to the voltage source $V_{CC}$ and the fifth resistor $R_5$ 414e is connected to the ground. The overshoot current $I_{OVER}$ is generated at burst edges (e.g., when the BurstEN 330 transitions from low/high to high/low) and transmits along the third transmission line $TL_3$ coupled to the anode of the gain-section diode $D_0$ 402 through the second capacitor $C_2$ 412b. In some examples, a ratio of the fourth resistor $R_4$ 414d and the fifth resistor $R_5$ 414e is proportional to a magnitude of the overshoot current $I_{OVER}$. The overshoots generated by the accelerating heating stage 428 is configured to speed up the laser temperature stabilizing process, and therefore, shorten the burst-on and burst-off times.

The diodes $D_1$ 416a, $D_2$ 416b are connected to the voltage source $V_{CC}$ and may balance direct current (DC) voltages at the outputs of the differential pair of MOSFETs $M_1$ 408a, $M_2$ 408b in the modulation stage 424 and at the outputs of the differential pair of MOSFETs $M_3$ 408c, $M_4$ 408d in the sinking stage 426.

Figure 5:
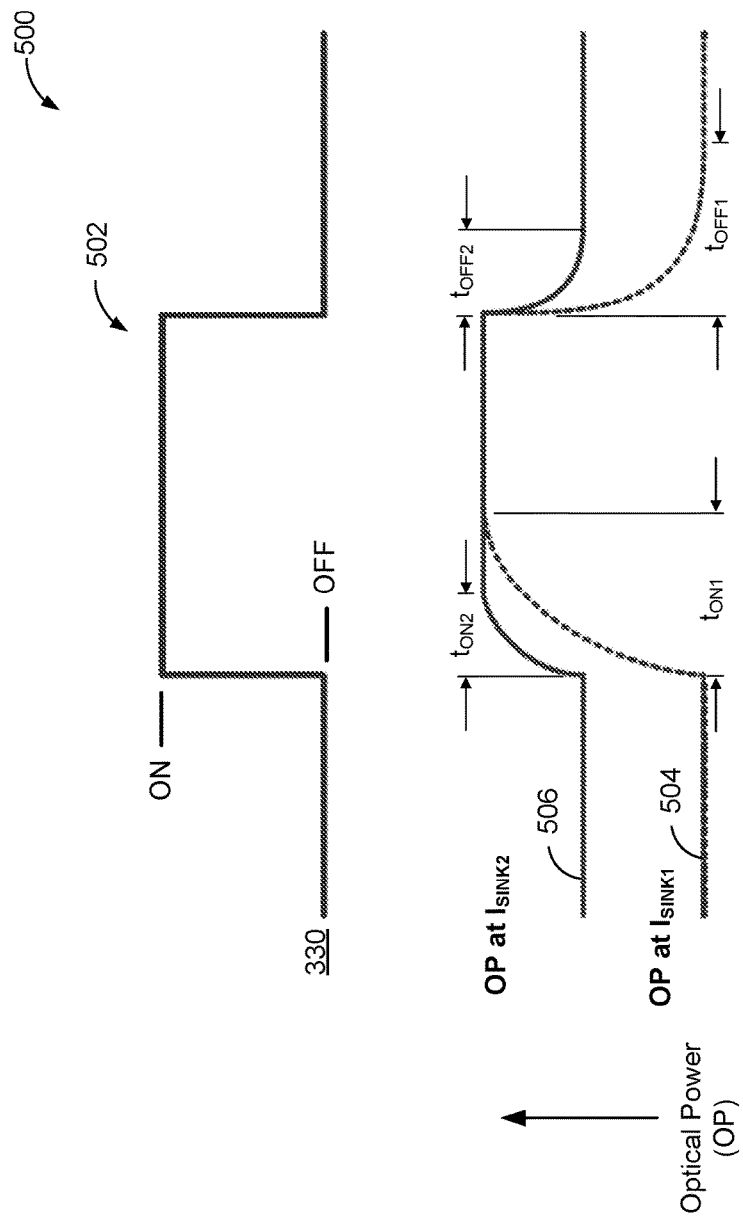
FIG. 5 illustrates a plot depicting burst-on state and burst-off state times based on optical power of a laser for different magnitudes of sink current applied by the laser driving circuit of FIG. 4.

The sinking stage 426 is configured to shorten the transition times between the burst-on and burst-off states to speed up wavelength stabilization during burst mode cycles. FIG. 5 illustrates a plot 500 depicting burst-on state and burst-off state times based on optical power (OP) of the laser 310 for different magnitudes of sink current $I_{SINK}$ during the burst-off state. The x-axis depicts time. Profile line 502 depicts the burst mode signal (Burst Enable) 330 indicative of the burst off-state (OFF) or the burst off-state (ON). Profile line 504 depicts the OP of the laser 310 for a first magnitude of sink current $I_{SINK1}$ and profile line 506 depicts the OP of the laser 310 for a second magnitude of sink current $I_{SINK2}$ that is less than the first magnitude of sink current $I_{SINK1}$. The y-axis for profile lines 504 and 506 depicts optical power.

In the example plot 500, the first magnitude of sink current $I_{SINK1}$ is set to a value substantially close to the bias current $I_{BIAS}$ delivered to the anode of the gain-section diode $D_0$ 402. As a result, the second diode current $I_{D2}$ (i.e., the bias current $I_{BIAS}$ minus the sink current $I_{SINK1}$) delivered to the gain-section diode $D_0$ 402 is close to zero during the burst-off state. During a transition from the burst-off state to the burst-on state, the anode of the gain-section diode $D_0$ 402 charges from a first voltage near zero until the OP of the laser 310 depicted by the profile line 504 reaches a stabilized OP in a first burn-on time $t_{ON1}$. Here, the stabilized OP corresponds to an optical power at the laser 310 suitable for transmitting the optical signal 104u from the ONU 140 to the OLT 120 at the transmit wavelength $\lambda_{Tx}$, which is determined by the magnitudes of $I_{BIAS}$ and $I_{MOD}$. During a transition back to the burst-off state from the burst-on state, the anode of the gain-section diode $D_0$ 402 discharges back to the first voltage near zero to reduce the OP of the laser 310 depicted by profile line 504 in a first burn-off time $t_{OFF1}$.

On the other hand, the second magnitude of sink current $I_{SINK2}$ is set to a value less than the $I_{SINK1}$ to thereby deliver a second diode current $I_{D2}$ (i.e., the bias current $I_{BIAS}$ minus the sink current $I_{SINK2}$) greater than zero to the anode of the gain-section diode $D_0$ 402 during the burst-off state. As a result, the OP of the laser 310 at the second magnitude of sink current $I_{SINK2}$ depicted by profile line 506 is greater than the OP of the laser 310 at the first magnitude of sink current $I_{SINK1}$ depicted by profile line 504 when the burst mode signal 330 is indicative of the burst-off state. In some examples, the second magnitude of sink current $I_{SINK2}$ is tunable to provide a current that is slightly less than the threshold current for the gain-section diode $D_0$ 402 during the burn-off state. Accordingly, the amount of heat applied to the laser 310 during the burst-off state may be maximized while simultaneously ceasing the transmission of optical signals 104u to the OLT 120. Here, the temperature differences between the burst-on and burst-off states can be minimized to minimize wavelength drift.

During a transition from the burst-off state to the burst-on state, the anode of the gain-section diode $D_0$ 402 charges from a second voltage greater than the first voltage until the OP of laser 310 depicted by profile line 506 reaches the stabilized OP in a second burn-on time $t_{ON2}$. The second burn-on time $t_{ON2}$ associated with the second magnitude of sink current $I_{SINK2}$ is shorter than the first burn-on time $t_{ON1}$ associated with the first magnitude of sink current $I_{SINK1}$ because it charges from a higher initial voltage. During a transition back to the burst-off state from the burst-on state, the anode of the gain-section diode $D_0$ 402 discharges back to the second voltage to reduce the OP of the laser 310 depicted by profile line 506 to the magnitude slightly less than the threshold OP in a second burn-off time $t_{OFF2}$. Here, the second burn-off time $t_{OFF2}$ associated with the second magnitude of sink current $I_{SINK2}$ is shorter than the first burn-off time $t_{OFF1}$ associated with the first magnitude of sink current $I_{SINK1}$ because it does not have to discharge to a zero voltage.

Figure 6:
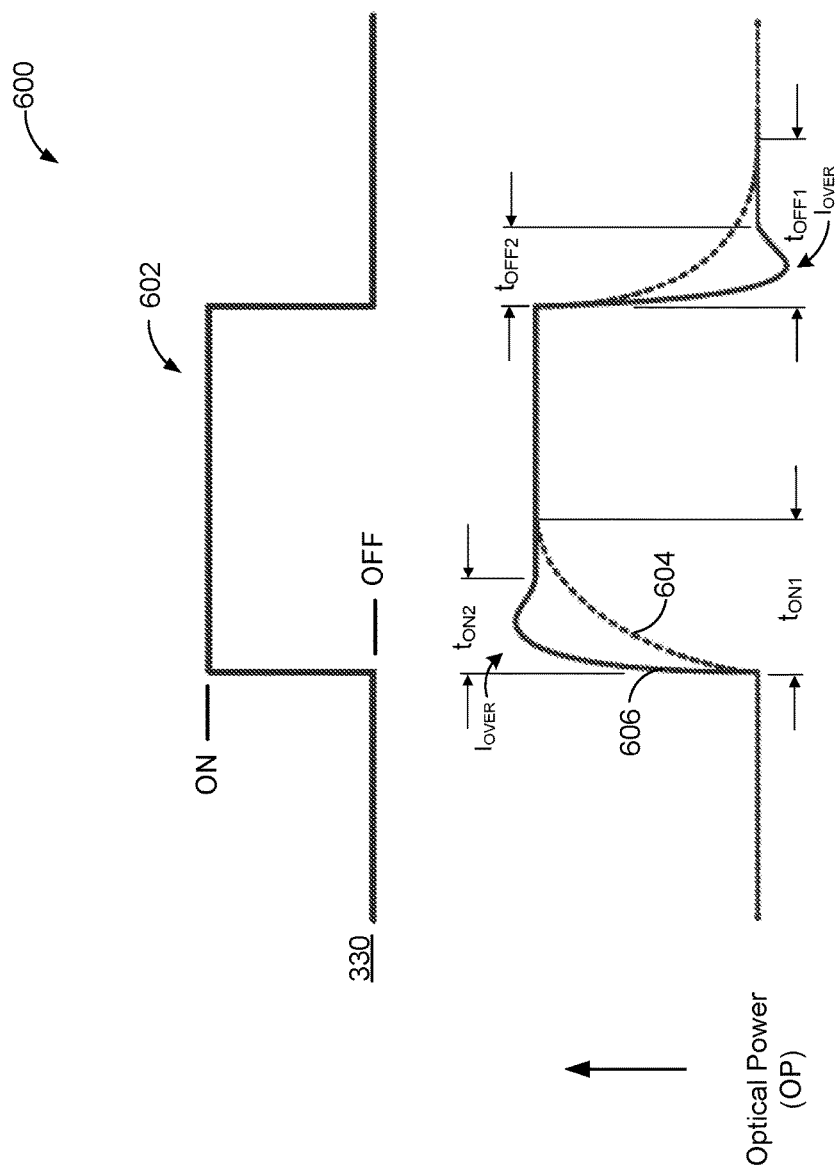
FIG. 6 illustrates a plot depicting burst-on state and burst-off state times based on optical power of a laser with and without accelerated heating for a gain-section diode of the laser driving circuit of FIG. 4.

As with the sinking stage 426, the accelerating heating stage 428 (i.e., heating stage 428) is also configured to shorten the transition times between the burst-on and burst-off states to speed up wavelength stabilization during burst mode duty cycles. FIG. 6 illustrates a plot 600 depicting burst-on state and burst-off state times based on optical power (OP) of the laser 310 with and without accelerated heating of the gain-section diode $D_0$ 402. The x-axis depicts time. Profile line 602 depicts the burst mode signal (Burst Enable) 330 indicative of the burst off-state (OFF) or the burst off-state (ON). Profile line 604 depicts the OP setup process of the laser 310 during bursts when the heating stage 428 of the laser driving circuit 400 is not used so no overshoot current $I_{OVER}$ is added to the anode of the gain-section diode $D_0$ 402. Profile line 606 depicts the OP of the laser 310 when the heating stage 428 of the laser driving circuit 400 delivers the overshoot current $I_{OVER}$ to the anode of the gain-section diode $D_0$ 402 to accelerate heating of the gain-section diode $D_0$ 402. The y-axis for profile lines 604 and 606 depicts optical power.

Without delivery of the AC-coupled overshoot current $I_{OVER}$ via the third transmission line $TL_3$ of the laser driving circuit 400, the OP of the laser 310 depicted by profile line 604 takes a first burst-on time $t_{ON1}$ to increase to a threshold optical power during a burst mode transition from the burst-off state to the burst-on state. The stabilized OP corresponds to an optical power at the laser 310 suitable for transmitting the optical signal 104u from the ONU 140 to the OLT 120 at the transmit wavelength $\lambda_{Tx}$. During a burst mode transition back to the burst-off state from the burst-on state, the OP of the laser 310 takes a first burst-off time $t_{OFF1}$ to decrease from the threshold optical power.

When the heating stage 428 is capacitively coupled by the second capacitor $C_2$ 412b to the anode of the gain-section diode $D_0$ 402 to deliver the overshoot current $I_{OVER}$ to the gain-section diode $D_0$ 402, the OP of the laser 310 depicted by profile line 606 takes a second burst-on time $t_{ON2}$ to increase to the stabilizing OP during the burst mode transition from the burst-off state to the burst-on state. In some examples, the heating stage 428 delivers the overshoot current $I_{OVER}$ to the anode of the gain-section diode $D_0$ 402 for a transition period of time after commencement of the burst-on state. The transition period of time is less than a burst-on period of time corresponding to a duration of the burst-on state. In other words, the delivery of the overshoot current $I_{OVER}$ during the transition period occurs over a portion of the duration (i.e., at burst edges) of the burst-on state. As the second burn-on time $t_{ON2}$ associated with the accelerated heating from delivery of the AC-coupled overshoot current $I_{OVER}$ is shorter than the first burn-on time $t_{ON1}$ without the accelerate heating, the transition time from burst-off state to the burst-on state is reduced. During a transition back to the burst-off state from the burst-on state, the OP of the laser 310 depicted by profile line 606 decreases from the threshold optical power in a second burn-off time $t_{OFF2}$ shorter than the first burn-off time $t_{OFF1}$. As the second burn-off time $t_{OFF2}$ is shorter than the first burn-off time $t_{OFF1}$, the capacitively coupling of the heating stage 428 reduces the transition time from the burst-on state to the burst-off state. The extra heat generated by the overshoot current speeds up the temperature stabilizing process and shortens the burst times.

Figure 7:
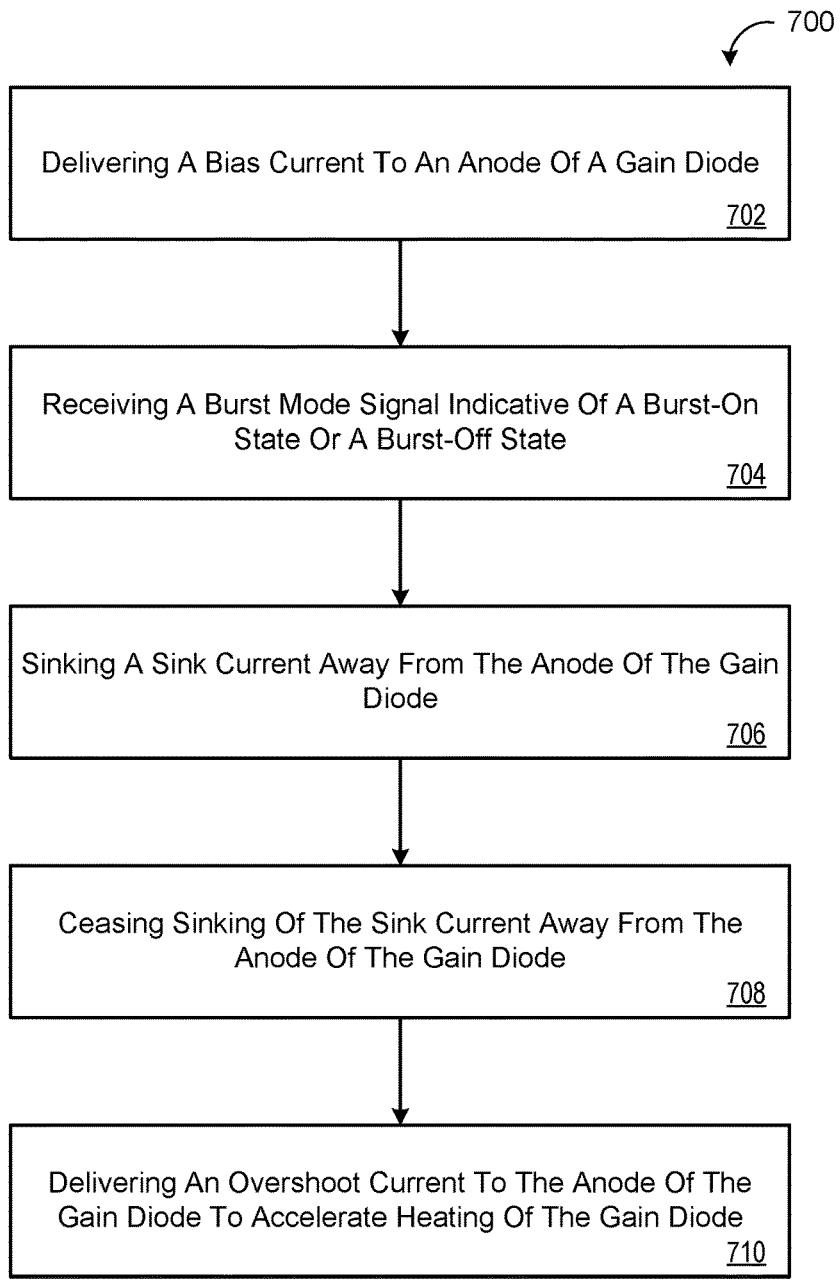
FIG. 7 is a schematic view of an example arrangement of operations for a method of biasing a tunable laser during burst-on and burst-off states through a common-cathode laser driving circuit.

FIG. 7 is a flowchart of an example method 700 for biasing a tunable laser 310 during burst-on and burst-off states through a common-cathode laser driving circuit 400. The flowchart starts at operation 702 when the laser driving circuit 400 delivers a bias current $I_{BIAS}$ to an anode of a gain-section diode $D_0$ 402 disposed on a shared substrate of a multi-section tunable laser 310. A voltage source $V_{CC}$ connected to an inductor $L_2$ 410b may deliver the bias current $I_{BIAS}$ to the anode of the gain-section diode $D_0$ 402. At operation 704, the method 700 includes receiving, at the laser driving circuit 400, a burst mode signal 330 indicative of the burst-on state or the burst-off state.

At operation 706, when the burst mode signal 330 is indicative of the burst-off state, the method 700 includes sinking, by the laser driving circuit 400, a sink current $I_{SINK}$ away from the anode of the gain-section diode $D_0$ 402. Here, the sink current $I_{SINK}$ is less than the bias current $I_{BIAS}$ to draw a portion of the bias current $I_{BIAS}$ away from the gain-section diode $D_0$ 402 to cease transmission of optical signals 104u, while at the same time applying heat to the laser 310 while not in use. Thus, the gain-section diode $D_0$ 402 receives a diode current $I_{D2}$ equal to $I_{BIAS}$ minus the $I_{SINK}$.

At operation 708, when the burst mode signal 330 transitions to be indicative of the burst-on state from the burst-off state, the method 700 includes ceasing, by the laser driving circuit 400, the sinking of the sink current $I_{SINK}$ away from the anode of the gain-section diode $D_0$ 402. Accordingly, the gain-section diode $D_0$ 402 receives a diode current $I_{D1}$ equal to $I_{BIAS}$. In some examples, the laser driving circuit 400 modulates the laser 310 by a capacitively coupled modulation stage 424 of the circuit 400 to the anode of the gain-section diode $D_0$ 402 to result in an alternating current (AC) modulation current $I_{MOD}$. For instance, the modulation stage 424 may provide data information within the modulation current $I_{MOD}$ and AC-couple the $I_{MOD}$ to the anode of the gain-section diode $D_0$ 402 so that optical power of the laser is based on the magnitude of the $I_{BIAS}$.

Moreover, at operation 710, when the burst mode signal 330 transitions to be indicative of the burst-on state from the burst-off state, the method 700 further includes delivering, by the laser driving circuit 400, an overshoot current $I_{OVER}$ to the anode of the gain-section diode $D_0$ 402 to accelerate heating of the gain-section diode $D_0$ 402. In some examples, the laser driving circuit 400 delivers the overshoot current $I_{OVER}$ to the anode of the gain-section diode $D_0$ 402 for a transition period of time after commencement of the burst-on state. In these examples, the transition period of time is less than a burst-on period of time corresponding to a duration of the burst-on state. In other words, the transition period of time may occur only over a portion of the duration (i.e., at burst edges) of the burst-on state. The laser driving circuit 400 may include an accelerating heating stage 428 capacitively coupled by a capacitor $C_2$ 412b to the anode of the gain-section diode $D_0$ 402 to deliver the overshoot current $I_{OVER}$ to the anode of the gain-section diode $D_0$ 402. The heating stage 428 may include first and second resistors $R_4$ 414d, $R_5$ 414e and a ratio of the first and second resistors $R_4$ 414d, $R_5$ 414e may be proportional to a magnitude of the overshoot current $I_{OVER}$.

Figure 8:
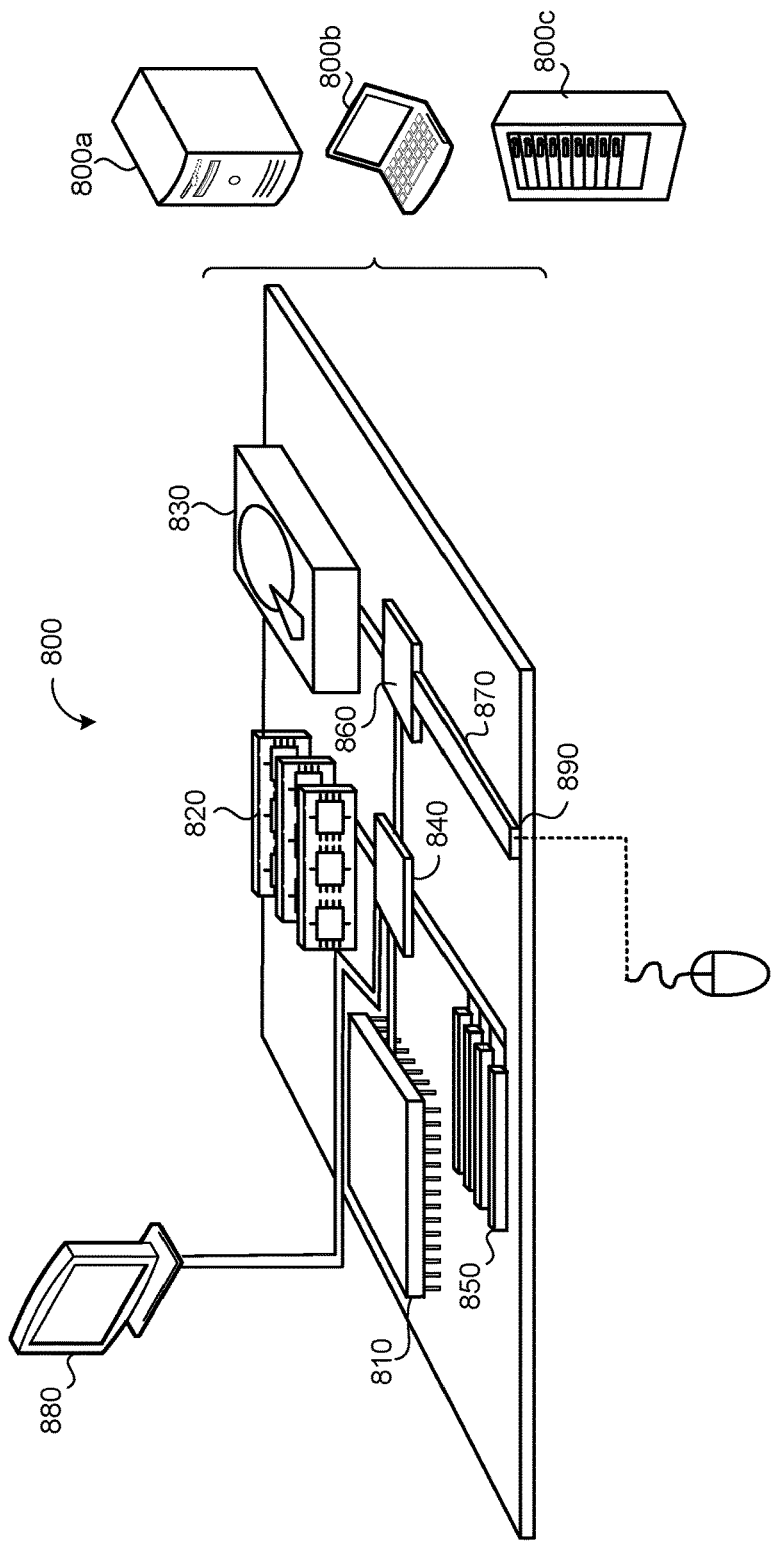
FIG. 8 is schematic view of an example computing device that may be used to implement the systems and methods described in this document.

FIG. 8 is a schematic view of an example computing device 800 that may be used to implement and control the systems and methods described in this document, for example, to program the magnitudes of $I_{MOD}$, $I_{SINK}$, $V_{REG}$, or control the BurstEn, DAT+, DAT− signals etc. The computing device 800 is intended to represent various forms of digital computers, such as laptops, desktops, workstations, personal digital assistants, servers, blade servers, mainframes, and other appropriate computers. The components shown here, their connections and relationships, and their functions, are meant to be exemplary only, and are not meant to limit implementations of the inventions described and/or claimed in this document.

The computing device 800 includes a processor 810, memory 820, a storage device 830, a high-speed interface/controller 840 connecting to the memory 820 and high-speed expansion ports 880, and a low speed interface/controller 860 connecting to low speed bus 870 and storage device 830. Each of the components 810, 820, 830, 840, 850, and 860, are interconnected using various busses, and may be mounted on a common motherboard or in other manners as appropriate. The processor 810 can process instructions for execution within the computing device 800, including instructions stored in the memory 820 or on the storage device 830 to display graphical information for a graphical user interface (GUI) on an external input/output device, such as display 880 coupled to high speed interface 840. In other implementations, multiple processors and/or multiple buses may be used, as appropriate, along with multiple memories and types of memory. Also, multiple computing devices 800 may be connected, with each device providing portions of the necessary operations (e.g., as a server bank, a group of blade servers, or a multi-processor system).

The memory 820 stores information non-transitorily within the computing device 800. The memory 820 may be a computer-readable medium, a volatile memory unit(s), or non-volatile memory unit(s). The non-transitory memory 820 may be physical devices used to store programs (e.g., sequences of instructions) or data (e.g., program state information) on a temporary or permanent basis for use by the computing device 800. Examples of non-volatile memory include, but are not limited to, flash memory and read-only memory (ROM)/programmable read-only memory (PROM)/erasable programmable read-only memory (EPROM)/electronically erasable programmable read-only memory (EEPROM) (e.g., typically used for firmware, such as boot programs). Examples of volatile memory include, but are not limited to, random access memory (RAM), dynamic random access memory (DRAM), static random access memory (SRAM), phase change memory (PCM) as well as disks or tapes.

The storage device 830 is capable of providing mass storage for the computing device 800. In some implementations, the storage device 830 is a computer-readable medium. In various different implementations, the storage device 830 may be a floppy disk device, a hard disk device, an optical disk device, or a tape device, a flash memory or other similar solid state memory device, or an array of devices, including devices in a storage area network or other configurations. In additional implementations, a computer program product is tangibly embodied in an information carrier. The computer program product contains instructions that, when executed, perform one or more methods, such as those described above. The information carrier is a computer- or machine-readable medium, such as the memory 820, the storage device 830, or memory on processor 810.

The high speed controller 840 manages bandwidth-intensive operations for the computing device 800, while the low speed controller 860 manages lower bandwidth-intensive operations. Such allocation of duties is exemplary only. In some implementations, the high-speed controller 840 is coupled to the memory 820, the display 880 (e.g., through a graphics processor or accelerator), and to the high-speed expansion ports 850, which may accept various expansion cards (not shown). In some implementations, the low-speed controller 860 is coupled to the storage device 830 and low-speed expansion port 870. The low-speed expansion port 870, which may include various communication ports (e.g., USB, Bluetooth, Ethernet, wireless Ethernet), may be coupled to one or more input/output devices, such as a keyboard, a pointing device, a scanner, or a networking device such as a switch or router, e.g., through a network adapter.

The computing device 800 may be implemented in a number of different forms, as shown in the figure. For example, it may be implemented as a standard server 800a or multiple times in a group of such servers 800a, as a laptop computer 800b, or as part of a rack server system 800c.

Various implementations of the systems and techniques described herein can be realized in digital electronic and/or optical circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" and "computer-readable medium" refer to any computer program product, non-transitory computer readable medium, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

The processes and logic flows described in this specification can be performed by one or more programmable processors executing one or more computer programs to perform functions by operating on input data and generating output. The processes and logic flows can also be performed by special purpose logic circuitry, e.g., an FPGA (field programmable gate array) or an ASIC (application specific integrated circuit). Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, one or more aspects of the disclosure can be implemented on a computer having a display device, e.g., a CRT (cathode ray tube), LCD (liquid crystal display) monitor, or touch screen for displaying information to the user and optionally a keyboard and a pointing device, e.g., a mouse or a trackball, by which the user can provide input to the computer. Other kinds of devices can be used to provide interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

A number of implementations have been described. Nevertheless, it will be understood that various modifications may be made without departing from the spirit and scope of the disclosure. Accordingly, other implementations are within the scope of the following claims.

What is claimed is:

1. A method comprising:
    delivering, by a laser driving circuit, a bias current to an anode of a gain-section diode disposed on a shared substrate of a tunable laser;
    receiving, at the laser driving circuit, a burst mode signal indicative of a burst-on state or a burst-off state;
    when the burst mode signal is indicative of the burst-off state, sinking, by the laser driving circuit, a sink current away from the bias current at the anode of the gain-section diode, the sink current less than the bias current delivered to the anode of the gain-section diode; and
    when the burst mode signal is indicative of the burst-on state, modulating, by the laser driving circuit, the tunable laser by a capacitively coupled modulation stage of the laser driving circuit to the anode of the gain-section diode, resulting in an alternating current (AC) modulation current.

2. The method of claim 1, further comprising, when the burst mode signal transitions to be indicative of the burst-on state from the burst-off state:
    ceasing, by the laser driving circuit, the sinking of the sink current away from the bias current at the anode of the gain-section diode; and
    delivering, by the laser driving circuit, an overshoot current to the anode of the gain-section diode to accelerate heating of the gain-section diode.

3. The method of claim 2, further comprising delivering, by the laser driving circuit, the overshoot current to the anode of the gain-section diode for a transition period of time after commencement of the burst-on state, the transition period of time less than a burst-on period of time corresponding to a duration of the burst-on state.

4. The method of claim 3, wherein the laser driving circuit comprises an accelerating heating stage capacitively coupled to the anode of the gain-section diode to deliver the overshoot current to the anode of the gain-section diode, the heating stage comprising one of a metal-oxide-semiconductor field-effect transistor (MOSFET) or a Bipolar Junction Transistor (BJT) connected to a burst mode signal source and first and second resistors, a ratio of the first and second resistors proportional to a magnitude of the overshoot current.

5. The method of claim 1, wherein when the burst mode signal is indicative of the burst-off state, the gain-section diode receives a diode current equal to the bias current minus the sink current.

6. The method of claim 1, further comprising receiving, at the laser driving circuit, a sink current adjustment from a sinking stage of the laser driving circuit, the sink current adjustment configured to adjust the sink current.

7. The method of claim 6, wherein the sinking stage comprises a differential pair of first and second MOSFETs, each MOSFET connected to a burst mode signal source, the first MOSFET connected to a resistor, the resistor connected to a voltage source, the second MOSFET connected to an inductor connected to the anode of the gain-section diode.

8. The method of claim 7, wherein:
    the first MOSFET is turned off and the second MOSFET is turned on to sink the sink current away from the anode of the gain-section diode when the burst mode signal is indicative of the burst-off state; and
    the first MOSFET is turned on and the second MOSFET is turned off to cease sinking of the sink current away from the anode of the gain-section diode when the burst mode signal is indicative of the burst-on state.

9. The method of claim 6, wherein the sinking stage comprises a differential pair of first and second BJTs, each BJT connected to a burst mode signal source, the first BJT connected to a resistor, the resistor connected to a voltage source, the second BJT connected to an inductor connected to the anode of the gain-section diode.

10. The method of claim 9, wherein:
    the first BJT is turned off and the second BJT is turned on to sink the sink current away from the anode of the gain-section diode when the burst mode signal is indicative of the burst-off state; and
    the first BJT is turned on and the second BJT is turned off to cease sinking of the sink current away from the anode of the gain-section diode when the burst mode signal is indicative of the burst-on state.

11. The method of claim 1, wherein the modulation stage comprises a differential pair of first and second MOSFETs, each MOSFET connected to a burst mode signal source and a data signal source, the first MOSFET connected to a first resistor, the first resistor connected to a voltage source, the second MOSFET connected by a capacitor to the anode of the gain-section diode.

12. The method of claim 11, wherein the second MOSFET is connected to a second resistor connected to a variable voltage source.

13. The method of claim 1, wherein the modulation stage comprises a differential pair of first and second BJTs, each BJT connected to a burst mode signal source and a data signal source, the first BJT connected to a first resistor, the first resistor connected to a voltage source, the second BJT connected by a capacitor to the anode of the gain-section diode.

14. The method of claim 13, wherein the second BJT is connected to a second resistor connected to a variable voltage source.

15. The method of claim 1, wherein the tunable laser comprises a multi-section tunable laser.

16. A common-cathode laser driving circuit comprising:
    a voltage source configured to deliver a bias current to an anode of a gain-section diode disposed on a shared substrate of a tunable laser;
    a sinking stage configured to receive a burst mode signal indicative of a burst-on state or a burst-off state, the sinking stage configured to:
        when the burst mode signal is indicative of the burst-off state, sink a sink current away from the bias current at the anode of the gain-section diode, the sink current less than the bias current received by the anode of the gain-section diode; and
        when the burst mode signal is indicative of the burst-on state, cease the sinking of the sink current away from the bias current at the anode of the gain-section diode; and
    a modulation stage capacitively coupled to the anode of the gain-section diode, the modulation stage configured to output an alternating current (AC) modulation current when the burst mode signal is indicative of the burst-on state.

17. The laser driving circuit of claim 16, wherein when the burst mode signal is indicative of the burst-off state, the gain-section diode receives a diode current equal to the bias current minus the sink current.

18. The laser driving circuit of claim 16, wherein the sinking stage comprises a differential pair of first and second metal-oxide-semiconductor field-effect transistors (MOSFETs), each MOSFET connected to a burst mode signal source, the first MOSFET connected to a resistor, the resistor connected to a voltage source, the second MOSFET connected to an inductor connected to the anode of the gain-section diode.

19. The laser driving circuit of claim 18, wherein:
the first MOSFET is turned off and the second MOSFET is turned on to sink the sink current away from the anode of the gain-section diode when the burst mode signal is indicative of the burst-off state; and
the first MOSFET is turned on and the second MOSFET is turned off to cease the sinking of the sink current away from the anode of the gain-section diode when the burst mode signal is indicative of the burst-on state.

20. The laser driving circuit of claim 16, wherein the sinking stage comprises a differential pair of first and second Bipolar Junction Transistors (BJTs), each BJT connected to a burst mode signal source, the first BJT connected to a resistor, the resistor connected to a voltage source, the second BJT connected to an inductor connected to the anode of the gain-section diode.

21. The laser driving circuit of claim 20, wherein:
the first BJT is turned off and the second BJT is turned on to sink the sink current away from the anode of the gain-section diode when the burst mode signal is indicative of the burst-off state; and
the first BJT is turned on and the second BJT is turned off to cease the sinking of the sink current away from the anode of the gain-section diode when the burst mode signal is indicative of the burst-on state.

22. The laser driving circuit of claim 16, wherein the modulation stage comprises a differential pair of first and second MOSFETs, each MOSFET connected to a burst mode signal source and a data signal source, the first MOSFET connected to a first resistor, the first resistor connected to a voltage source, the second MOSFET connected by a capacitor to the anode of the gain-section diode.

23. The laser driving circuit of claim 22, wherein the second MOSFET is connected to a second resistor connected to a variable voltage source.

24. The laser driving circuit of claim 16, wherein the modulation stage comprises a differential pair of first and second BJTs, each BJT connected to a burst mode signal source and a data signal source, the first BJT connected to a first resistor, the first resistor connected to a voltage source, the second BJT connected by a capacitor to the anode of the gain-section diode.

25. The laser driving circuit of claim 24, wherein the second BJT is connected to a second resistor connected to a variable voltage source.

26. The laser driving circuit of claim 16, wherein the sinking stage is configured to output a sink current adjustment, the sink current adjustment configured to adjust the sink current.

27. The laser driving circuit of claim 16, wherein the tunable laser comprises a multi-section tunable laser.

* * * * *